(12) United States Patent
Yao et al.

(10) Patent No.: US 11,990,921 B2
(45) Date of Patent: May 21, 2024

(54) LIST DECODING OF POLARIZATION-ADJUSTED CONVOLUTIONAL CODES

(71) Applicant: The Regents of the University of California, Oakland, CA (US)

(72) Inventors: Hanwen Yao, San Diego, CA (US); Arman Fazeli Chaghooshi, San Diego, CA (US); Alexander Vardy, Escondido, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/906,447

(22) PCT Filed: Mar. 16, 2021

(86) PCT No.: PCT/US2021/022526
§ 371 (c)(1),
(2) Date: Sep. 15, 2022

(87) PCT Pub. No.: WO2021/188513
PCT Pub. Date: Sep. 23, 2021

(65) Prior Publication Data
US 2023/0179229 A1    Jun. 8, 2023

Related U.S. Application Data

(60) Provisional application No. 62/990,376, filed on Mar. 16, 2020.

(51) Int. Cl.
*H03M 13/29* (2006.01)
*H03M 13/23* (2006.01)
(Continued)

(52) U.S. Cl.
CPC ....... *H03M 13/2933* (2013.01); *H03M 13/23* (2013.01); *H03M 13/2939* (2013.01); *H03M 13/2732* (2013.01); *H03M 13/612* (2013.01)

(58) Field of Classification Search
CPC ......... H03M 13/2933; H03M 13/2939; H03M 13/23
See application file for complete search history.

(56) References Cited

U.S. PATENT DOCUMENTS

| | | |
|---|---|---|
| 2007/0226594 A1 | 9/2007 | Lablans |
| 2014/0019820 A1 | 1/2014 | Vardy et al. |

(Continued)

OTHER PUBLICATIONS

Bin, L. et al. "An adaptive successive cancellation list decoder for Polar codes with Cyclic Redundancy Check," IEEE Communications Letters, vol. 16, No. 12, pp. 2044-2047, Dec. 2012.

(Continued)

*Primary Examiner* — Joseph D Torres
(74) *Attorney, Agent, or Firm* — Perkins Coie LLP

(57) ABSTRACT

Devices, systems and methods for list decoding of polarization-adjusted convolutional (PAC) codes are described. One example method for improving error correction in a decoder for data in a communication channel includes receiving a noisy codeword, the codeword having been generated using a polarization-adjusted convolutional (PAC) code and provided to the communication channel prior to reception by the decoder, and performing PAC list decoding on the noisy codeword, wherein an encoding operation of the PAC code comprises a convolutional precoding operation that generates one or more dynamically frozen bits, and wherein the PAC list decoding comprises extending, based on the one or more dynamically frozen bits, at least two paths of a plurality of paths in the PAC list decoding differently and independently.

16 Claims, 7 Drawing Sheets

(51) Int. Cl.
    *H03M 13/00* (2006.01)
    *H03M 13/27* (2006.01)

(56) References Cited

U.S. PATENT DOCUMENTS

| | | | |
|---|---|---|---|
| 2014/0208183 A1 | 7/2014 | Mahdavifar et al. | |
| 2015/0263767 A1 | 9/2015 | Shin et al. | |
| 2019/0036552 A1 | 1/2019 | Sasoglu et al. | |
| 2020/0036477 A1 | 1/2020 | Xu et al. | |
| 2020/0076451 A1* | 3/2020 | Poulin | H04L 1/0041 |
| 2020/0177211 A1* | 6/2020 | Fazeli Chaghooshi | H03M 13/2933 |
| 2020/0412385 A1* | 12/2020 | Arikan | H03M 13/2906 |

OTHER PUBLICATIONS

EPO, Extended European Search Report for European Application No. 21771886.5, mailed on Mar. 28, 2023, 18 pages.

Fazeli, A. et al. "Convolutional decoding of polar codes," Proc. IEEE International Symposium on Information Theory, pp. 1397-1401, Paris, France, Jul. 2019.

Fazeli, A. et al. "Viterbi-aided successive-cancellation decoding of polar codes," Proc. IEEE Global Communications Conference, pp. 1-6, Singapore, Dec. 2017.

ISA, International Search Report and Written Opinion for PCT Application No. PCT/US2021/022526. Mail Date: May 25, 2021. 15 pages.

Li, B. et al. "An adaptive successive cancellation list decoder for polar codes with cyclic redundancy check," IEEE Commun. Lett., vol. 16, No. 12, pp. 2044-2047, Dec. 2012.

Miloslavskaya, V. et al. "Sequential decoding of polar codes," IEEE Commun. Lett., vol. 16, No. 7, pp. 1127-1130, Jul. 2014.

Mohammad, R. et al. "Polarization-adjusted convolutional (PAC) codes: Fano decoding vs list decoding," IEEE Transactions on Vehicular Technology, pp. 1-13, Feb. 2020.

Niu, K. et al. "CRC-aided decoding of polar codes," IEEE Commun. Lett., vol. 16, No. 10, pp. 1668-1671, Oct. 2012.

Tal, I. et al. "List decoding of Polar codes," IEEE Transactions on Information Theory, vol. 61, No. 5, pp. 2213-2226, May 2015.

Trifonov, P. "Polar codes with dynamic frozen symbols and their decoding by directed search," Proc. IEEE Information Theory Workshop, pp. 1-5, Sevilla, Spain, Sep. 2013.

* cited by examiner

Algorithm 1: List Decoder for PAC Codes

Input: The received vector $y$, the list size $L$, the generator $c = (c_0, c_1, \ldots, c_v)$ for the convolutional precoder as global

Output: Decoded codeword $\hat{x}$

// Initialization

1   ⋯ lines 2–5 of Algorithm 12 in [39]
2   shiftRegisters ← new 2-D array of size $L \times (v+1)$
3   for $l = 0, 1, \ldots, L-1$ do
4       shiftRegister$[l] = (0, 0, \ldots, 0)$ // Main Loop 5   for $\phi = 0, 1, \ldots, n-1$ do
6       recursivelyCalcP$(m, \phi)$
7       if $u_\phi$ is *frozen* then
8           for $l = 0, 1, \ldots, L-1$ do
9               if *activePath*$[l]$ = false then
10                   continue
11               left-shift shiftRegister$[l]$ by one, with the rightmost position set to 0
12               $C_m \leftarrow$ getArrayPointer$C(m, l)$
13               $(v_{\phi-v}, v_{\phi-v+1}, \ldots, v_\phi) \leftarrow$ shiftRegister$[l]$ // Set the frozen bit 14               $C_m[0][\phi \bmod 2] \leftarrow \sum_{j=0}^{v} c_j v_{\phi-j}$
15       else
16           continuePaths_Unfzn$(\phi)$
17       if $(\phi) \bmod 2 = 1$ then
18           recursivelyUpdateC$(m, \phi)$ // Get the best codeword in the list 19   ⋯ lines 17–24 of Algorithm 12 in [39]
20   return $\hat{x} = \left( C_0[\beta][0] \right)_{\beta=0}^{n-1}$

*FIG. 2*

| Algorithm 2: continuePaths_Unfzn (PAC version) |
|---|

Input: phase $\phi$

1 ⋯ lines 1–18 of Algorithm 13 in [39]
   // Continue relevant paths
2 for $l = 0, 1, ..., L-1$ do
3    if $contForks[l][0]$ = false *and* $contForks[l][1]$ = false then
4      continue
5    $C_m \leftarrow$ getArrayPointer_C$(m, l)$
6    left-shift shiftRegister$[l]$ by one, with the rightmost position set to 0
7    $\left(v_{\phi-\nu}, v_{\phi-\nu+1}, ..., v_{\phi}\right) \leftarrow$ shiftRegister$[l]$
8    if $contForks[l][0]$ = true *and* $contForks[l][1]$ = true then
9      $C_m[0][\phi \bmod 2] \leftarrow \sum_{j=0}^{\nu} c_j v_{\phi-j}$
10      $l' \leftarrow$ clonePath$(l)$
11      shiftRegister$[l'] \leftarrow$ shiftRegister$[l]$
12      flip the rightmost bit of shiftRegister$[l']$
13      $C_m \leftarrow$ getArrayPointer_C$(m, l')$
14      $\left(v'_{\phi-\nu}, v_{\phi-\nu+1}, ..., v'_{\phi}\right) \leftarrow$ shiftRegister$[l']$
15      $C_m[0][\phi \bmod 2] \leftarrow \sum_{j=0}^{\nu} c_j v'_{\phi-j}$
16    else
17      if $contForks[l][0]$ = true then
18        if $\sum_{j=0}^{\nu} c_j v_{\phi-j} = 1$ then
19          flip the rightmost bit of shiftRegister$[l]$
20        set $C_m[0][\phi \bmod 2] \leftarrow 0$
21      else
22        if $\sum_{j=0}^{\nu} c_j v_{\phi-j} = 0$ then
23          flip the rightmost bit of shiftRegister$[l]$
24        set $C_m[0][\phi \bmod 2] \leftarrow 1$

FIG. 3

LIST DECODING OF POLARIZATION-ADJUSTED CONVOLUTIONAL CODES

CROSS-REFERENCE TO RELATED APPLICATION

This patent document is a 371 National Phase Application of International Application No. PCT/US2021/022526, filed on Mar. 16, 2021, which claims priority to and benefits of U.S. Provisional Patent Application No. 62/990,376 filed on Mar. 16, 2020. The entire contents of the above patent applications are incorporated by reference as part of the disclosure of this patent document.

TECHNICAL FIELD

This document generally relates to error correction codes, and more particularly to the list decoding of polarization-adjusted convolutional codes.

BACKGROUND

A communications system generally adopts channel encoding to improve reliability of data transmission and ensure quality of communications in the presence of various types of noise and errors. Polar coding is a general and extremely powerful error-correction technology proposed around a decade ago, and which is currently used for coding the control channels in the eMBB mode of the Fifth Generation (5G) wireless standard. In addition to wireless communications, polar codes may have applications in fiber-optic networks, data storage, satellite communications, and more.

SUMMARY

Embodiments of the disclosed technology relate to methods, systems and devices for list decoding of polarization-adjusted convolutional (PAC) codes that can be used in various communication systems, including but not limited to wireless systems, wired systems, and data storage systems. The described embodiments provide, among other features and benefits, distinct advantages over sequential decoding in certain scenarios such as low-SNR regimes or situations where the worst-case decoding complexity or latency is the primary constraint.

In an example aspect, a method for improving error correction in a decoder for data in a communication channel includes receiving a noisy codeword, the codeword having been generated using a polarization-adjusted convolutional (PAC) code and provided to the communication channel prior to reception by the decoder, and performing PAC list decoding on the noisy codeword, wherein an encoding operation of the PAC code comprises a convolutional pre-coding operation that generates one or more dynamically frozen bits, and wherein the PAC list decoding comprises extending, based on the one or more dynamically frozen bits, at least two paths of a plurality of paths in the PAC list decoding differently and independently.

In another example aspect, a system for improving error correction includes an encoder configured to receive a plurality of information symbols, generate a plurality of precoded symbols by performing a precoding operation on the plurality of information symbols, wherein the plurality of precoded symbols comprises one or more dynamically frozen symbols, generate a codeword comprising a plurality of polar encoded symbols by performing a polar encoding operation on the plurality of precoded symbols, and provide the codeword for transmission or storage, and a decoder configured to receive a noisy codeword, the noisy codeword having been generated by providing the codeword to a communication channel prior to reception by the decoder, and perform list decoding on the noisy codeword, wherein the list decoding comprises extending, based on the one or more dynamically frozen symbols, at least two paths of a plurality of paths in the list decoding differently and independent.

In yet another example aspect, the above-described methods may be implemented by an apparatus or device that comprises a processor and/or memory.

In yet another example aspect, these methods may be embodied in the form of processor-executable instructions and stored on a computer-readable program medium.

The subject matter described in this patent document can be implemented in specific ways that provide one or more of the following features.

BRIEF DESCRIPTION OF THE DRAWINGS

FIG. 2 illustrates an example algorithm for the list decoding of PAC codes.

FIG. 3 illustrates an example algorithm for the list pruning operation of the list decoding algorithm illustrated in FIG. 2.

DETAILED DESCRIPTION

Polar coding is a general and extremely powerful error-correction technology proposed around a decade ago, and can provably achieve capacity with efficient encoding and decoding for a wide range of channels. Polar codes maximize the rate and reliability of data transmissions, and are poised to significantly improve coding performance for 5G. At the same time, they reduce the complexity of design and ensure service quality. Polar codes are a type of linear block error correcting code, whose code construction is based on a multiple recursive concatenation of a short kernel code which transforms the physical channel into virtual outer channels. When the number of recursions becomes large, the virtual channels tend to either have high reliability or low reliability (in other words, they polarize), and the data bits are allocated to the most reliable channels.

However, the performance of polar codes at short block lengths under standard successive-cancellation decoding is far from optimal. A well-known way to improve the performance of polar codes at short block lengths is cyclic redundancy check (CRC) precoding followed by successive-cancellation list decoding.

Polarization-adjusted convolutional (PAC) codes provide an improvement in performance as compared to CRC-precoded polar codes with list decoding. These codes are based primarily upon the following main ideas: replacing CRC precoding with convolutional precoding (under appropriate rate profiling) and replacing list decoding by sequential decoding.

Figure 1:
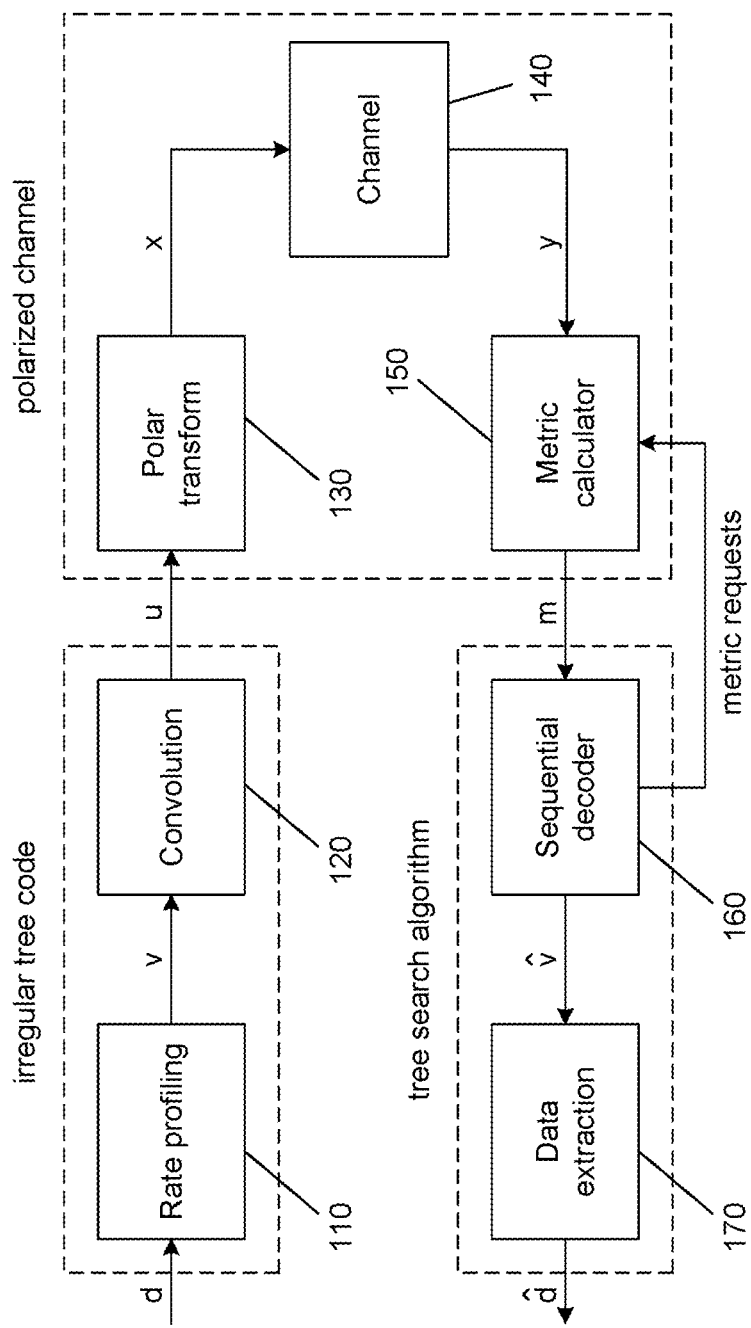
FIG. 1 illustrates an example of polarization-adjusted convolutional (PAC) coding scheme with sequential decoding.

The motivating idea for PAC codes is the recognition that 0-1 rate assignments waste the capacities C(Wi) of bit-channels Wi whose inputs are fixed by the rate assignment Ri=0. The capacity loss is especially significant at practical (small to moderate) block-lengths N since polarization takes place relatively slowly. In order to prevent such capacity loss, a scheme that avoids fixing the input of any bit-channel is needed. PAC codes achieve this by placing an outer convolutional coding block in front of the polar transform as shown in FIG. 1.

Sequential decoding (e.g., Fano decoding or Viterbi decoding), which was originally proposed for PAC codes, has historically been the natural choice for decoding convolutional codes, and in recent academic literature, list decoding has been characterized as being inferior to sequential decoding for PAC code. Despite this prevailing sentiment, embodiments of the disclosed technology enable list decoding of PAC codes based, in part, on the recognition that PAC codes are polar codes with dynamically frozen bits. Recognizing that the latency of sequential decoding is variable and depends on the noise level and channel realization, whereas the list decoding run-time is independent of the channel, the list decoding of PAC codes (also referred to as PAC list decoding) according to the disclosed embodiments provides advantages over sequential decoding. These advantages are particularly relevant for low signal-to-noise ratio (SNR) regimes and worst-case complexity and latency regimes.

Worst-case complexity and latency regimes are those cases that measure the resources (e.g., hardware usage, power consumption, or running time) that an algorithm requires given an input of an arbitrary size (denoted n), and provides an upper bound on the resources required by the particular algorithm. In the example of running time, the worst-case time-complexity indicates the longest running time performed by an algorithm given any input of size n, and guarantees that the algorithm will finish in the indicated period of time.

Section headings are used in the present document for ease of understanding and do not limit the applicability of techniques and embodiments disclosed in each section only to that section.

Overview of Polarization Adjusted Convolutional (PAC) Codes

The block length n of PAC codes, similar to polar codes, is also a power of 2. That is, $n=2^m$ with $m \geq 1$. As illustrated in FIG. 1, the encoding process for an (n, k) PAC code includes the following three steps: rate-profiling (110), convolutional precoding (120), and polar encoding (130). In the first step, the k data (information) bits (or symbols) of the data vector d are embedded into a data-carrier vector v of length n, at k positions specified by an index set $\mathcal{A} \subseteq [0, 1, \ldots, n-1]$ with $|\mathcal{A}|=k$. The remaining n–k positions in v are frozen to zero. This step, along with the choice of $\mathcal{A}$, is referred to as rate-profiling (110).

In some embodiments, the set $\mathcal{A}$ is selected to include the best bit-channels in terms of their capacity, and is referred to as polar rate-profiling. In other embodiments, the set $\mathcal{A}$ is selected to include the bit-channels with the highest Hamming weights, which is referred to as Reed-Muller (RM) rate-profiling. In yet other embodiments, the set $\mathcal{A}$ can be selected to support other rate-profiling schemes (e.g., polarized capacity rate profile, cutoff rate profile, unpolarized capacity rate profile).

In the second step (120), the data vector v resulting from the rate-profiling step is encoded using a rate-1 convolutional code generated by $c=(c_0, c_1, \ldots, c_v)$, with $c_0=c_v=1$ (the latter being assumed without loss of generality), which produces another vector $u=(u_0, u_1, \ldots, u_{n-1})$ of length n, where:

$$u_0=c_0v_0, u_1=c_0v_1+c_1v_0, u_2=c_0v_2+c_1v_1+c_2v_0$$

and so on. In general, every bit in u is a linear combination of (v+1) bits of v computed via the convolution operation:

$$u_i = \sum_{j=0}^{v} c_j v_{i-j}. \qquad \text{Eq. (1)}$$

Herein, for $i-j<0$, $v_{i-j}=0$ by convention. Alternatively, this step can be viewed as a vector-matrix multiplication u=vT, where T is an upper-triangular Toeplitz matrix.

In the third step (130), the vector u is encoded by a conventional polar encoder as the codeword $x=uP_m$, where $$P_m = B_n \begin{bmatrix} 1 & 0 \\ 1 & 1 \end{bmatrix}^{\otimes m}$$

Herein, $B_n$ is the n×n bit-reversal permutation matrix and $P_m$ is known as the polar transform matrix.

On the decoding side, and as illustrated in FIG. 1, sequential decoding (160) of the underlying convolutional code can be employed to decode the data-carrier vector v (170). Under the frozen-bit constraints imposed by rate-profiling, the rate-1 convolutional code becomes an irregular tree code. In an example, a Fano sequential decoder may be used for the sequential decoding of irregular tree codes. In this case, the path metrics (computed in 150) at the input to the sequential decoder are obtained via repeated calls to the successive-cancellation decoder for the underlying polar code.

PAC List Decoding

Embodiments of the disclosed technology use a list-decoding algorithm, with complexity $\mathcal{O}(Ln \log n)$ where L is the list size, to decode PAC codes by recognizing that PAC codes are polar codes with dynamically frozen bits. In conventional polar coding, it is common practice to set all frozen bit to zero. That is, $u_i=0$ for all $i \in \mathcal{F}$, where $\mathcal{F} \subset \{0, 1, \ldots, n-1\}$ denotes the set of frozen indices. However, this choice is arbitrary and some frozen bits can be fixed to 1 and other frozen bits fixed to 0. What matters is that the frozen bits are fixed and, therefore, known apriori to the decoder.

However, the frozen bits can remain known a priori to the decoder even when the dynamic freezing approach is applied. That is, instead of fixing the frozen bits to either 0 and 1, a frozen bit can be set as:

$$u_i=f_i(u_0,u_1,\ldots,u_{i-1}).$$

Herein, $f_i$ is a fixed Boolean function (in some embodiments, a linear function) that is known apriori to the decoder. Thus, the decoder can decide as follows:

$$\hat{u}_i=f_i(\hat{u}_0,\hat{u}_1,\ldots,\hat{u}_{i-1}).$$

Herein, $\hat{u}_0, \hat{u}_1, \ldots, \hat{u}_{i-1}$ are the earlier decisions made by the decoder. The approach shown above is referred to as dynamic freezing.

It is noted that PAC codes fit into the dynamic freezing framework based on the bits in u being the vector-matrix product of v and a sub-matrix of the upper-triangular Toeplitz matrix T that is used to represent the linear combination discussed above. The Toeplitz matrix being upper-triangular ensures that a current bit being decoded is only based on bits that have been decoded prior to the current bit and on frozen bits, all of which are known a priori to the decoder when the current bit is being decoded. Thus, representing PAC codes as polar codes results in certain information bits also being regarded as dynamic.

Referring back to the index set notation, the PAC list decoder can successively compute the vector $\hat{v}=(\hat{v}_0, \hat{v}_1, \ldots, \hat{v}_{n-1})$ as follows. If $i \in \mathcal{A}^c$, set $\hat{v}_i=0$. Otherwise, set $$\hat{v}_i = \hat{u}_i - \sum_{j=1}^{v} c_j \hat{v}_{i-j}.$$

Herein, the value of $\hat{u}_i$ is provided by the polar decoder. Given $\hat{v}_i, \hat{v}_{i-1}, \ldots, \hat{v}_{i-v}$, the values of the dynamically frozen bits $\hat{u}_i$ for $i \in \mathcal{A}^c$ can be computed using Equation (1). This computation, along with the one above, takes linear time. All that is required is additional memory to store the vector $\hat{v}=(\hat{v}_0, \hat{v}_1, \ldots, \hat{v}_{n-1})$.

In some embodiments, a dynamically frozen bit can be a function of one or more previous frozen bits. In other embodiments, a dynamically frozen bit can be a function of an information bit and one or more previously decoded bits. For example, a dynamically frozen bit can be interpreted as an "information bit b'[i]" that depends on an information bit, b[i], and one or more previously decoded information and/or frozen bits.

In some embodiments, the list decoding of PAC codes can be performed by leveraging successive-cancellation list decoding of polar codes using the algorithms illustrated in, for example, FIGS. 2 and 3. As illustrated in lines 2-4, 11 and 13-14 of FIG. 2 and lines 6-7, 9, 11-12, 14-15, 18-19 and 22-23 of FIG. 3, the list decoding of PAC codes can be implemented using data structures that include L shift register circuits for each of the L paths of the successive-cancellation list decoder. To advantageously ensure a more efficient hardware implementation of the algorithm, the shift register circuits used in the list decoding are the same shift register circuits used in the convolutional precoding operation. In an example, each of the L shift register circuits include (v+1) shift registers, where v references Equation (1).

The algorithms described in FIGS. 2 and 3 provide, amongst other features and benefits, the following technical solutions:

(1) In conventional polar codes, when the list decoder encounters a frozen index $i \in \mathcal{F}$, all the paths in the list-decoding tree are extended in the same way, by setting $\hat{u}_i=0$. However, for PAC codes, since freezing is dynamic, different paths are potentially extended differently, depending upon the previous decisions along the path.

(2) Although the list decoder for PAC codes maintains the same data structure as the successive-cancellation list decoder for conventional polar codes, for a list size of L, L shift register circuits (or auxiliary shift registers), one for each path, are introduced. Each such shift register stores the last v bits of the vector 9 for the corresponding path.

Figure 4:
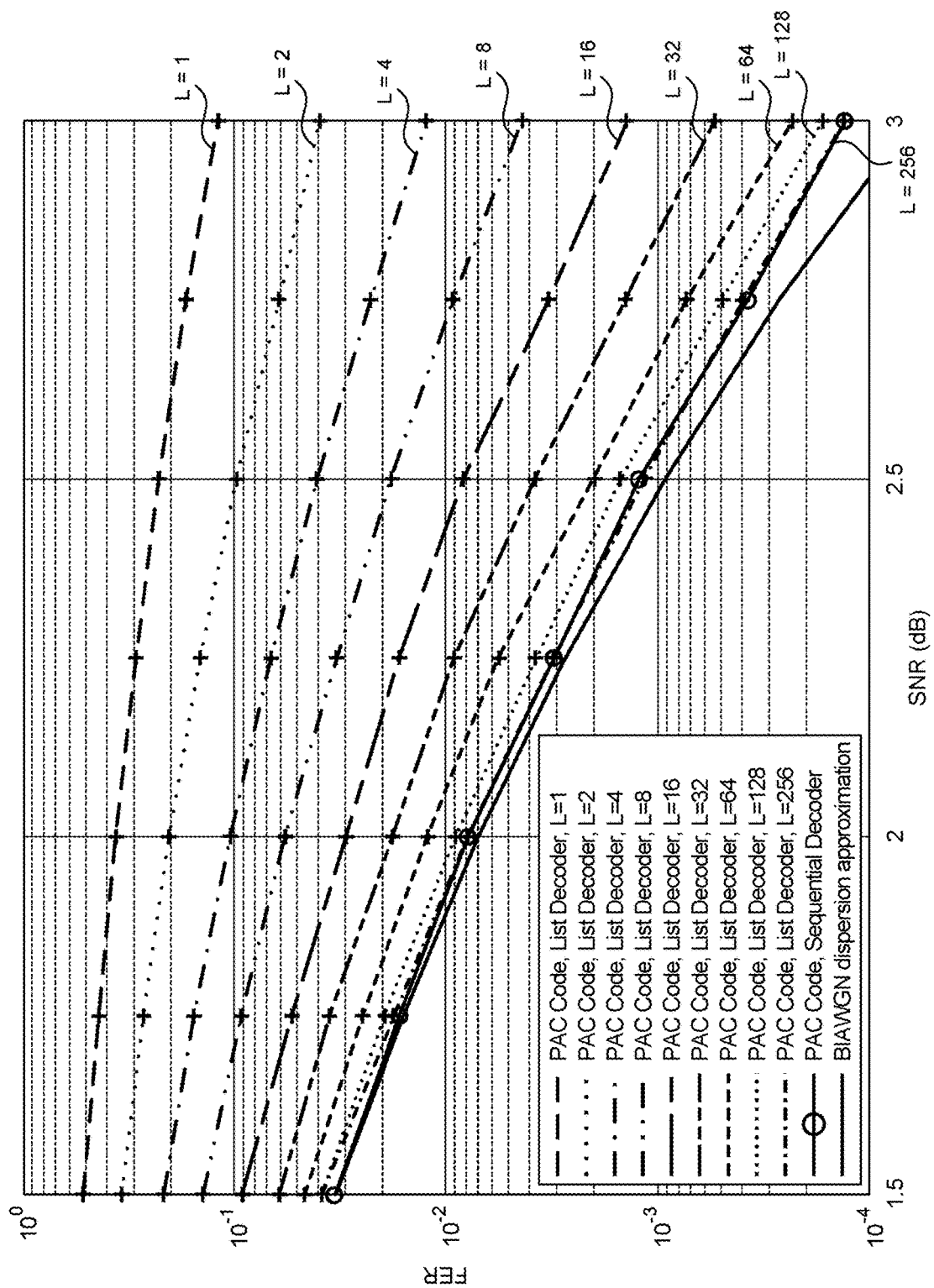
FIG. 4 illustrates the performance of example PAC codes under list decoding.

FIG. 4 illustrates the performance of PAC codes under list decoding, which shows the frame error rate (FER) as a function of SNR (in dB) of a list decoder with a list size (L) and compared to a sequential decoder and the binary input additive white Gaussian noise (BIAWGN) dispersion-bound approximation for binary codes of rate 1/2 and length 128.

As shown therein, the performance of list decoding steadily improves with increasing list size. For L=128, the list-decoding performance is very close to that of sequential decoding, while for L=256, the two curves virtually coincide over the entire range of SNRs.

It is noted that the FER for list decoding is due to two distinct error mechanisms. In some cases, the transmitted codeword is not among the L codewords generated by the decoding algorithms described herein. In other cases, it is on the list of codewords generated, but it is not the most likely among them. Since the list decoder selects the most likely codeword on the list as its ultimate output, this leads to a decoding error. These instances are referred to as selection errors. Thus, to overcome this limitation, embodiments of the disclosed technology can be configured to either use underlying codes with an increased minimum distance or employ the use of a mechanism (e.g., cyclic redundancy check (CRC)) to aid with selecting from the list.

Figure 5:
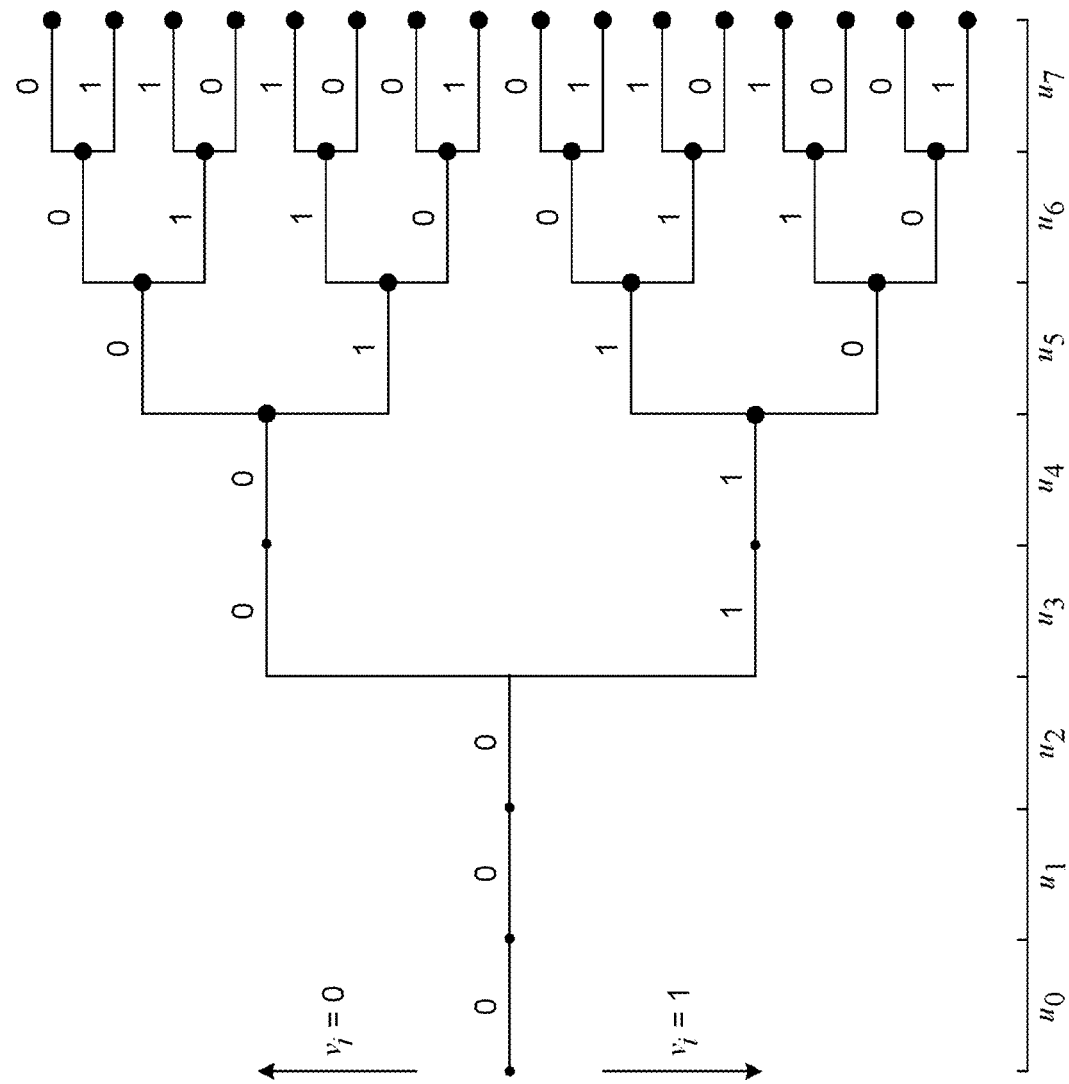
FIG. 5 illustrates an example of a polar search tree.

The described embodiments provide methods and systems for efficient list decoding of PAC codes, especially when compared to sequential decoding in low SNR regimes. FIG. 5 illustrates an example of a polar search tree that represents all possible inputs to a polar encoder, and is an irregular tree with n+1 levels containing $2^k$ paths. In the context of the polar search tree shown in FIG. 5, the list decoding algorithm can be regarded as a tree-search algorithm that tries to identify the most likely path in the tree by following L paths in the tree, from the root to the leaves, and selecting the most likely one at the end (analogous to a limited breadth Monte Carlo tree search). In contrast, the Fano sequential decoding algorithm follows only one path, but has many back-and-forth movements during the decoding process (analogous to a depth-first search).

Simulation results based on the polar search tree in FIG. 5 show that there is a tremendous gap between worst-case complexity and average complexity for sequential decoding, whereas for list decoding, the worst-case complexity is equal to the average complexity, and both are unaffected by SNR. Furthermore, the complexity of the list decoder only depends on the list size L and the code dimension k.

Embodiments of the disclosed technology describe a PAC list decoder that maintains list decoding complexity constraints and latency constraints, e.g., based only on the list size, while accounting for the worst-case decoding and latency constraints of a sequential decoder. For example, for an increased level of noise, e.g., in a low-SNR regime, the sequential decoder will necessarily take a longer time to decode, whereas the PAC list decoder requires the same latency and complexity over the entire range of SNRs.

In some embodiments, the complexity of the list decoding algorithm can be further reduced by using a genie-aided adaptive list decoding algorithm to determine an optimal (or near optimal) list size (L) based on decoding error probability. Over multiple runs of the list decoder, the following operations are performed:

(1) For each run, decode the received codeword using a list decoder with L=1;

(2) If at the end of the decoding process, the transmitted codeword does not lie in the list, double the list size, i.e., L←2×L; and (3) Repeat step (2) until either the transmitted codeword lies in the list (regardless of whether it is the most likely codeword in the list or not), or the list size reaches a predetermined maximum list size, $L_{max}$.

PAC Codes with Time-Varying Convolutional Precoding

In some embodiments, the generator $c=(c_0, c_1, \ldots, c_v)$ of the rate-1 convolutional precoder can be made time-varying, which advantageously enables the previously described performance to be achieved with a constraint length as low as v=2. This allows the use of trellis-based decoding methods (e.g., list-Viterbi decoding) to be used to decode PAC codes.

In some embodiments, random time-varying convolutional precoding can be incorporated, wherein the precoding coefficients are independent, identically distributed (i.i.d.) Bernoulli(1/2) random variables. That is, each of the precoding coefficients is set to 0 or 1 with probability 1/2, independent of each other. On the decoder side, Algorithms 1 and 2 (shown in FIGS. 2 and 3, respectively) can be modified by replacing $c_j$ with $c_j^{\Phi-j}$ in line 14 of Algorithm 1 and lines 9, 15, 18, 22 of Algorithm 2. The complexity of such modified list-decoding algorithm is exactly the same as before; the only difference being that the decoder now needs to store the n generators $c^0, c^1, \ldots, c^{n-1}$. However, this storage requirement is still linear in n.

Methods and Embodiments of the Disclosed Technology

Figure 6:
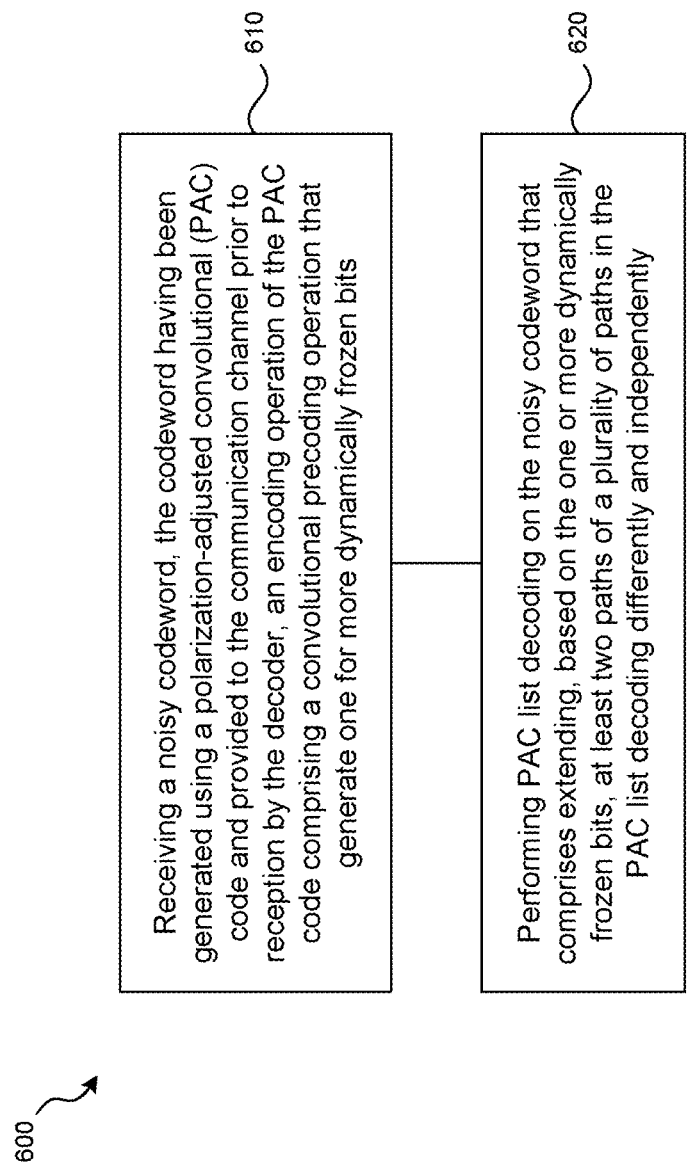
FIG. 6 is a flowchart of an exemplary method for list decoding of PAC codes.

FIG. 6 illustrates a flowchart of an example method for the list decoding of PAC codes. The method 600 includes, at operation 610, receiving a noisy codeword, the codeword having been generated using a polarization-adjusted convolutional (PAC) code and provided to the communication channel prior to reception by the decoder, an encoding operation of the PAC code comprising a convolutional precoding operation that generates one or more dynamically frozen bits.

The method 600 includes, at operation 620, performing PAC list decoding on the noisy codeword that comprises extending, based on the one or more dynamically frozen bits, at least two paths of a plurality of paths in the PAC list decoding differently and independently.

In some embodiments, the convolutional precoding operation is implemented using a plurality of auxiliary shift registers.

In some embodiments, each of the auxiliary shift registers is used for a corresponding path of the plurality of paths in the PAC list decoding.

In some embodiments, each of the one or more dynamically frozen bits is based on one or more previously decoded information bits or frozen bits.

In some embodiments, at least one of the one or more dynamically frozen bits corresponds to a high-reliability bit channel or a low-reliability bit channel.

In some embodiments, the method 600 further includes the operation of determining a list size (L) of a list for the PAC list decoding based on a genie-aided list decoding algorithm.

In some embodiments, the genie-aided list decoding algorithm comprises (a) decoding the noisy codeword using a PAC list decoder with L=1, (b) upon determining that a most likely version of the codeword is not in the list at the end of the run, doubling the list size, and (c) repeating step (b) until the mostly likely version of the codeword is in the list or the list size reached a predetermined maximum list size.

In some embodiments, the decoder is characterized by a worst-case decoding latency constraint that accounts for an arbitrary realization of the communication channel, and wherein a realization of the communication channel corresponds to the noisy codeword.

In some embodiments, the decoder is characterized by a worst-case decoding complexity constraint that provides an upper bound for a computational complexity of the PAC list decoding with an input with an arbitrary noise level.

In some embodiments, the communication channel is operating in a low signal-to-noise ratio (SNR) regime.

Embodiments of the disclosed technology include a system for improving error correction, which includes an encoder configured to receive a plurality of information symbols, generate a plurality of precoded symbols by performing a precoding operation on the plurality of information symbols, wherein the plurality of precoded symbols comprises one or more dynamically frozen symbols, generate a codeword comprising a plurality of polar encoded symbols by performing a polar encoding operation on the plurality of precoded symbols, and provide the codeword for transmission or storage, and a decoder configured to receive a noisy codeword, the noisy codeword having been generated by providing the codeword to a communication channel prior to reception by the decoder, and perform list decoding on the noisy codeword, wherein the list decoding comprises extending, based on the one or more dynamically frozen symbols, at least two paths of a plurality of paths in the list decoding differently and independent.

In some embodiments, the list decoding uses a decoding tree that is configured to account for the precoding operation.

In some embodiments, the precoding operation comprises one or more of a convolutional transform, a moving parity check bit operation, and a cyclic redundancy check (CRC) operation.

In some embodiments, the precoding operation comprises a convolutional precoding operation that is implemented using a plurality of auxiliary shift registers, and the decoder is further configured, as part of performing the list decoding, to generate, using the plurality of auxiliary shift registers, the one or more dynamically frozen symbols.

In some embodiments, each of the one or more dynamically frozen symbols is based on one or more previously decoded symbols or frozen symbols.

In some embodiments, the decoder is characterized by a worst-case decoding latency constraint that accounts for an arbitrary realization of the communication channel, and wherein a realization of the communication channel corresponds to the noisy codeword.

Figure 7:
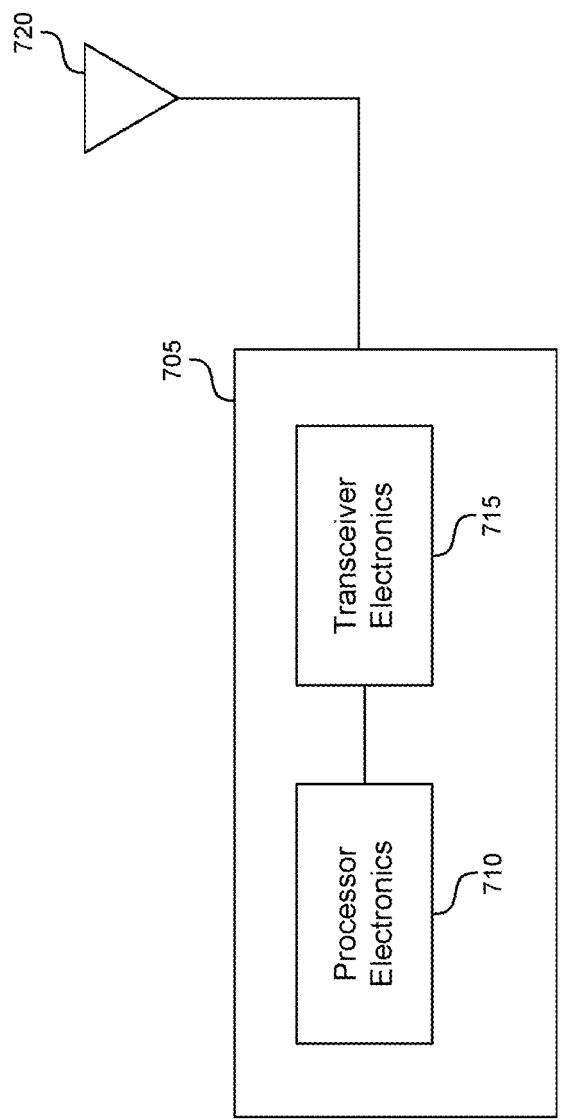
FIG. 7 is a block diagram representation of a portion of an apparatus, in accordance with some embodiments of the presently disclosed technology.

FIG. 7 is a block diagram representation of a portion of an apparatus, in accordance with some embodiments of the presently disclosed technology. An apparatus 705, such as a base station or a wireless device (or UE), can include processor electronics 710 such as a microprocessor that implements one or more of the techniques (including, but not limited to, method 200) presented in this document. The apparatus 705 can include transceiver electronics 715 to send and/or receive wireless signals over one or more communication interfaces such as antenna(s) 720. The apparatus 705 can include other communication interfaces for transmitting and receiving data. Apparatus 705 can include one or more memories (not explicitly shown) configured to store information such as data and/or instructions. In some implementations, the processor electronics 710 can include at least a portion of the transceiver electronics 715. In some embodiments, at least some of the disclosed techniques, modules or functions are implemented using the apparatus 705. The disclosed embodiments can be similarly implemented in devices that utilize wired communications, or other means of communication and/or storage and retrieval of information (e.g., hard disks, flash or other types of memory devices), that are susceptible to producing errors and can benefit from polar coding of information that is received by, or transmitted from, such devices.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses al apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving error correction in a decoder for data in a communication channel, comprising:
   receiving a noisy codeword, the codeword having been generated using a polarization-adjusted convolutional (PAC) code and provided to the communication channel prior to reception by the decoder; and
   performing PAC list decoding on the noisy codeword,
   wherein an encoding operation of the PAC code comprises a convolutional precoding operation that generates one or more dynamically frozen bits, and
   wherein the PAC list decoding comprises:
      extending, based on the one or more dynamically frozen bits, at least two paths of a plurality of paths in the PAC list decoding differently and independently.

2. The method of claim 1, wherein the convolutional precoding operation is implemented using a plurality of shift register circuits.

3. The method of claim 2, wherein each of the plurality of shift register circuits is used for a corresponding path of the plurality of paths in the PAC list decoding.

4. The method of claim 1, wherein each of the one or more dynamically frozen bits is based on one or more previously decoded information bits or frozen bits.

5. The method of claim 4, wherein at least one of the one or more dynamically frozen bits corresponds to a high-reliability bit channel or a low-reliability bit channel.

6. The method of claim 1, further comprising:
   determining a list size (L) of a list for the PAC list decoding based on a genie-aided list decoding algorithm.

7. The method of claim 6, wherein the genie-aided list decoding algorithm comprises:
(a) decoding the noisy codeword using a PAC list decoder with L=1;
(b) upon determining that a most likely version of the codeword is not in the list at an end of a run, doubling the list size; and
(c) repeating step (b) until the mostly likely version of the codeword is in the list or the list size reached a predetermined maximum list size ($L_{max}$).

8. The method of claim 1, wherein the decoder is characterized by a worst-case decoding latency constraint that accounts for an arbitrary realization of the communication channel, and wherein a realization of the communication channel corresponds to the noisy codeword.

9. The method of claim 1, wherein the decoder is characterized by a worst-case decoding complexity constraint that provides an upper bound for a computational complexity of the PAC list decoding with an input with an arbitrary noise level.

10. The method of claim 1, wherein the communication channel is operating in a low signal-to-noise ratio (SNR) regime.

11. A non-transitory computer-readable storage medium having instructions stored thereupon for improving an error correction capability of a decoder, comprising:
instructions for receiving a noisy codeword, the codeword having been generated using a polarization-adjusted convolutional (PAC) code and provided to a communication channel prior to reception by the decoder; and
instructions for performing PAC list decoding on the noisy codeword,
wherein an encoding operation of the PAC code comprises a convolutional precoding operation that generates one or more dynamically frozen bits, and
wherein the instructions for performing PAC list decoding comprise:
instructions for extending, based on the one or more dynamically frozen bits, at least two paths of a plurality of paths in the PAC list decoding differently and independently.

12. The storage medium of claim 11, further comprising:
instructions for determining a list size (L) of a list for the PAC list decoding based on a genie-aided list decoding algorithm.

13. The storage medium of claim 12, wherein the genie-aided list decoding algorithm comprises:
(a) decoding the noisy codeword using a list decoder with L=1;
(b) upon determining that a most likely version of the codeword is not in the list at an end of a run, doubling the list size; and
(c) repeating step (b) until the mostly likely version of the codeword is in the list or the list size reached a predetermined maximum list size ($L_{max}$).

14. The storage medium of claim 11, wherein the communication channel is operating in a low signal-to-noise ratio (SNR) regime.

15. The storage medium of claim 11, wherein the encoding operation of the PAC code includes a rate-profiling operation that precedes the convolutional precoding operation.

16. The storage medium of claim 15, wherein each of the plurality of shift register circuits comprises a first number of shift registers, and wherein the first number of shift registers is equal to a number of bits in an output of the rate-profiling operation.

* * * * *